United States Patent
Tran

[11] Patent Number: 6,097,236
[45] Date of Patent: Aug. 1, 2000

[54] SIGNAL TRANSFER SYSTEM AND METHOD USING AN INTERMEDIATE VOLTAGE

[75] Inventor: Hiep Van Tran, Dallas, Tex.

[73] Assignee: Texas Instruments Incorporated, Dallas, Tex.

[21] Appl. No.: 09/210,126

[22] Filed: Dec. 10, 1998

Related U.S. Application Data

[60] Provisional application No. 60/069,070, Dec. 10, 1997.

[51] Int. Cl.[7] ...................................................... H03L 5/00

[52] U.S. Cl. ........................ 327/333; 327/108; 327/91; 327/94; 326/38; 326/63; 326/82

[58] Field of Search .................................... 327/108, 111, 327/112, 91, 94, 333, 337, 551, 558; 326/38, 63, 82, 83, 87, 88

[56] References Cited

U.S. PATENT DOCUMENTS

| | | | |
|---|---|---|---|
| 5,541,526 | 7/1996 | Sandhu | 327/374 |
| 5,696,722 | 12/1997 | Yamauchi | 326/62 |
| 5,889,415 | 3/1999 | Parkinson | 326/68 |
| 5,973,538 | 10/1999 | Shou et al. | 327/344 |

*Primary Examiner*—Timothy P. Callahan
*Assistant Examiner*—An T. Luu
*Attorney, Agent, or Firm*—Robert D. Marshall, Jr.; W. James Brady, III; Frederick J. Telecky, Jr.

[57] ABSTRACT

A signal transfer system (10) includes a driver (12) coupled to a receiver (14) using a signal line (16). The driver (12) drives the signal line (16) from an intermediate voltage (22) to a selected first or second voltage to indicate a transition of the input (18). The use of the intermediate voltage (22) on the signal line (16) reduces the effective switching capacitance, which reduces power dissipated by the signal transfer system (10).

14 Claims, 2 Drawing Sheets

SIGNAL TRANSFER SYSTEM AND METHOD USING AN INTERMEDIATE VOLTAGE

This application claims priority under 35 USC §119(e)(1) of Provisional Application No. 60/069,070, filed Dec. 10, 1997.

TECHNICAL FIELD OF THE INVENTION

This invention relates generally to electronic circuits, and more particularly to a signal transfer system and method using an intermediate voltage.

BACKGROUND OF THE INVENTION

With improvements in fabrication technology, electronic circuits are becoming increasingly smaller in size with reduced power requirements. For example, fabrication techniques have drastically reduced the size and power requirements of integrated circuits. Despite these advances, electronic circuits still contain high capacitance signal lines that dissipate significant power as a function of capacitance, voltage, and switching frequency.

Several previous approaches attempt to reduce power dissipation caused by high capacitance signal lines. One approach reduces power by reducing the size of the circuit, which reduces capacitance on signal lines. Another approach attempts to locate components in an integrated circuit or other electronic circuit to minimize the length of signal lines between components. These approaches may contribute to a reduction in power dissipation of high capacitance signal lines, but the total power savings are limited by the physical and cost constraints of circuit size reduction and layout.

SUMMARY OF THE INVENTION

In accordance with the present invention, a signal transfer system and method are provided that substantially eliminate or reduce disadvantages or problems associated with previously developed systems and methods. In particular, the present invention provides a signal transfer system and method that uses an intermediate voltage to reduce the effective switching capacitance of the signal line.

In one embodiment of the present invention, a signal transfer system includes a signal line initially having an intermediate voltage between a first voltage and a second voltage. A driver coupled to the signal line receives an input and drives the signal line from the intermediate voltage to a first voltage if the input indicates a first transition, and from the intermediate voltage to a second voltage if the input indicates a second transition. A receiver coupled to the signal line generates an output in response to a selected one of the first voltage and the second voltage on the signal line.

Technical advantages of the present invention include a signal transfer system that reduces the effective switching capacitance of a signal line, and consequently the amount of power dissipated. This is accomplished by providing a driver and receiver coupled together by a signal line. The signal line may be a data or address bus of an integrated circuit, another on-chip or off-chip large load or large capacitance signal line, or any other signal line that experiences undesirable power dissipation due to increased capacitance. Instead of indicating signal transitions between a low voltage and a high voltage, the present invention performs logic transitions on the signal line that begin at an intermediate voltage. In a particular embodiment, the intermediate voltage may be approximately one-half the difference between a first voltage corresponding to logic one and a second voltage corresponding to logic zero. Driving signal line from the intermediate voltage to either the first or second voltages reduces the effective switching capacitance of the signal line to about one-half of the standard static circuit. A precharge signal, which may be periodic, sets the signal line to the intermediate voltage prior to indicating a transition. The invention also includes appropriate memory circuits to maintain a precharged state on the signal line when no signal transition occurs. Other technical advantages are readily apparent to one skilled in the art from the attached figures, description, and claims.

BRIEF DESCRIPTION OF THE DRAWINGS

For a more complete understanding of the present invention, and for further features and advantages thereof, reference is now made to the following description taken in conjunction with the accompanying drawings in which.

DETAILED DESCRIPTION OF THE INVENTION

Figure 1:
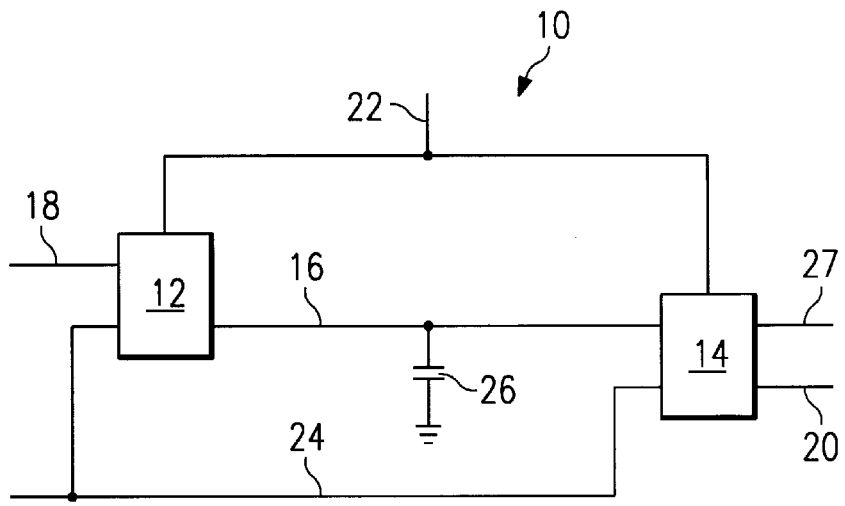
FIG. 1 illustrates a schematic block diagram of a signal transfer system constructed in accordance with the teachings of the present invention.

FIG. 1 illustrates a signal transfer system 10 that includes a driver 12 and a receiver 14 coupled by a signal line 16. In general, system 10 transfers a signal received on input 18 to an output 20 using a three voltage level logic to reduce the effective switching capacitance of signal line 16, which reduces the overall power dissipation of signal transfer system 10.

Driver 12 couples to input 18, an intermediate voltage 22, and a precharge signal 24. The output of driver 12 couples to the input of receiver 14 using signal line 16. Signal line 16 has a capacitance, indicated by capacitor 26, that may depend on the length of signal line 16, the number of destinations terminated by signal line 16, or other factors. Signal line 16 may be a portion of a data or address bus of an integrated circuit, another on-chip or off-chip large load or large capacitance signal line, or any other signal line that experiences undesirable power dissipation due to increased capacitance. Capacitor 26 coupled between signal line 16 and a reference voltage represents or contributes to the capacitance of signal line 16, but the present invention operates with any inherent or explicit capacitance that contributes to power dissipation as a signal is transferred from input 18 to output 20.

The input of receiver 14 couples to signal line 16. Receiver 14, like driver 12, also receives intermediate voltage 22 and precharge signal 24. Receiver 14 produces output 20 and an inverted output 27 in response to changes in input 18.

In operation, signal transfer system 10 operates to transfer a signal from input 18 to output 20 with reduced power dissipation on signal line 16. Generally, transferring a signal in system 10 contemplates indicating a logic transition between input 18 and output 20, indicating no logic transition between input 18 and output 20, or otherwise transferring information from input 18 to output 20. To initiate operation of system 10, driver 12 and receiver 14 receive a high precharge signal 24 to set signal line 16 to intermediate voltage 22. The value of intermediate voltage 22 is chosen to lie between a first voltage corresponding to a logic one and second voltage corresponding to a logic zero.

If input 18 presented to driver 12 indicates a transition or change in output 20, then driver 12 drives signal line 16 accordingly. In a first transition from logic zero on output 20 to logic one now indicated on input 18, driver 12 drives signal line 16 from intermediate voltage 22 to the first voltage. In a second transition from logic one on output 20 to logic zero now indicated on input 18, driver 12 drives signal line 16 from intermediate voltage 22 to the second voltage. If no transition occurs, driver 12 maintains signal line 16 at intermediate voltage 22. Receiver 14 senses the voltage on signal line 16 and produces a corresponding output 20. Upon sensing the first voltage on signal line 16, receiver 14 sets output 20 to logic one. Similarly, upon sensing the second voltage on signal line 16, receiver 14 sets output 20 to logic zero. If signal line 16 remains at intermediate voltage 22 indicating no transition, then receiver 14 maintains its current output 20. Receiver 14 also sets inverted output 27 to be logically opposite from output 20.

Since voltage swings on signal line 16 always begin at intermediate voltage 22, the transfer of a signal from input 18 to output 20 dissipates less power. As an example, consider an implementation of system 10 operating at a first voltage of four volts, a second voltage of zero volts, and intermediate voltage 22 of two volts. The first transition charges capacitor 26 from two volts to four volts, and the second transition discharges capacitor 26 from two volts to zero volts. In both transitions, the total voltage swing experienced at capacitor 26 is plus or minus two volts, as opposed to plus or minus four volts in a traditional two voltage level logic implementation. Using intermediate voltage 22 reduces the effective switching capacitance of signal line 16, which reduces power dissipated in system 10. This power savings becomes significant when the value of capacitor 26 is large in comparison to other components in system 10. This technique is particularly applicable to large load lines, such as data or address busses of an integrated circuit, or any other on-chip or off-chip signal lines that experience a relatively high capacitance.

Figure 2:
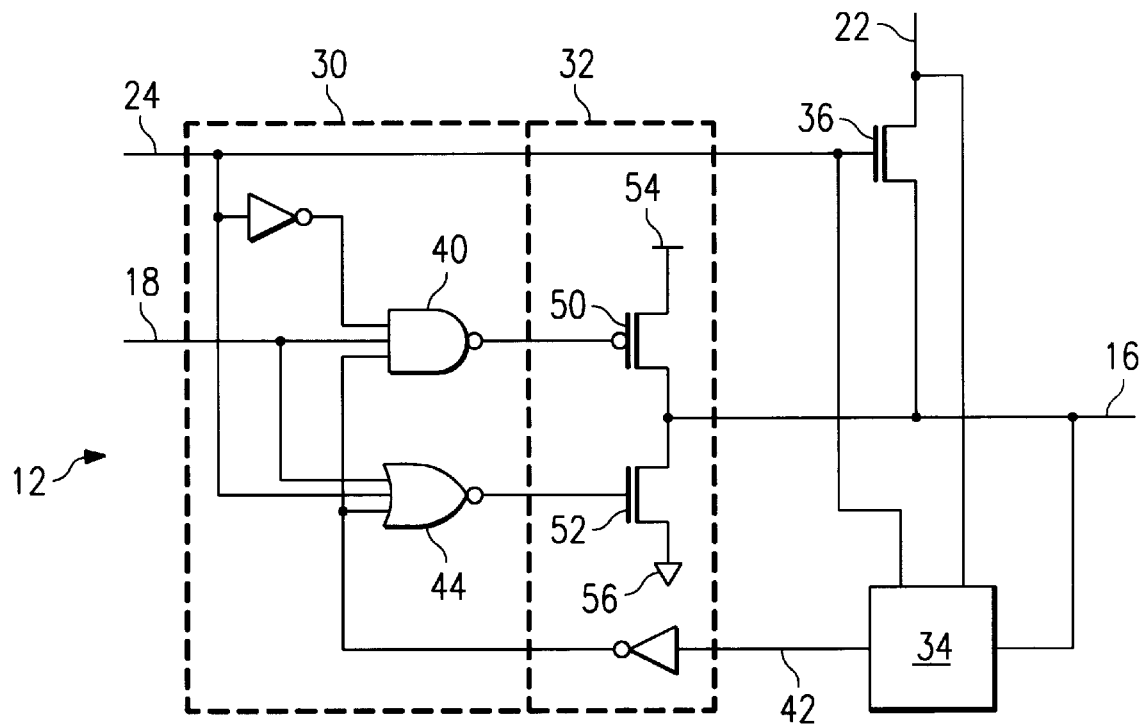
FIG. 2 illustrates a circuit diagram of a driver in the signal transfer system.

FIG. 2 illustrates driver 12, which includes a logic circuit 30, a switching circuit 32, a memory 34, and a reset transistor 36. Logic circuit 30 includes a NAND gate 40 with a first input coupled to input 18, a second input coupled to the inverse of precharge signal 24, and a third input coupled to the inverse of output 42 of memory 34. Logic circuit 30 also includes a NOR gate 44 having a first input coupled to input 18, a second input coupled to precharge signal 24, and a third input coupled to the inverse of output 42 of memory 34.

Switching circuit 32 includes a first transistor 50 and a second transistor 52. First transistor 50 has a source coupled to a first voltage 54, a gate coupled to the output of NAND gate 40, and a drain coupled to signal line 16. Second transistor 52 has a source coupled to a second voltage 56, a gate coupled to the output of NOR gate 44, and a drain coupled to signal line 16. In a particular embodiment, transistor 50 comprises a p-channel MOSFET and transistor 52 comprises an n-channel MOSFET.

Reset transistor 36 has a drain coupled to intermediate voltage 22, a gate coupled to precharge signal 24, and a source coupled to signal line 16. Memory 34 receives precharge signal 24 and intermediate voltage 22, and produces output 42 based on a previous state of signal line 16.

Although the sizing and power requirements may be different, memory 34 has a similar structure and operation as receiver 14, described below with reference to FIG. 3.

In operation, driver 12 receives a high precharge signal 24 which closes reset transistor 36 to set signal line 16 to intermediate voltage 22. A high precharge signal 24 also causes NAND gate 40 to close first transistor 50 and NOR gate 44 to close second transistor 52, which allows charging of capacitor 26 on signal line 16. A high precharge signal 24 also prepares memory 34 for a potential signal transition. Before, during, or after the high precharge signal 24, driver 12 receives input 18. Input 18 indicates a first transition (logic zero to logic one), a second transition (logic one to logic zero), or no transition.

In the first transition, input 18 is logic one and output 42 of memory 34 representing the previous state of input 18 is logic zero. While precharge signal 24 is low, and input 18 and output 42 of memory 34 indicate the first transition, NAND gate 40 closes first transistor 50 and NOR gate 44 opens second transistor 52. This state of transistors 50 and 52 drives signal line 16 from intermediate voltage 22 to first voltage 54. Memory 34 detects this change and stores a logic one.

In the second transition, input 18 is logic zero and output 42 of memory 34 representing the previous state of input 18 is logic one. While precharge signal 24 is low, and input 18 and output 42 of memory 34 indicate the second transition, NAND gate 40 opens first transistor 50 and NOR gate 44 closes second transistor 52. This state of transistors 50 and 52 drives signal line 16 from intermediate voltage 22 to second voltage 56. Again, memory 34 detects this transition and stores a logic zero.

When no transition occurs, input 18 and output 42 of memory 34 are the same, and NAND gate 40 opens first transistor 50 and NOR gate 44 opens second transistor 52. This state of transistors 50 and 42 maintains signal line 16 at intermediate voltage 22, subject to a potential small current leakage in capacitor 26 over time.

Figure 3:
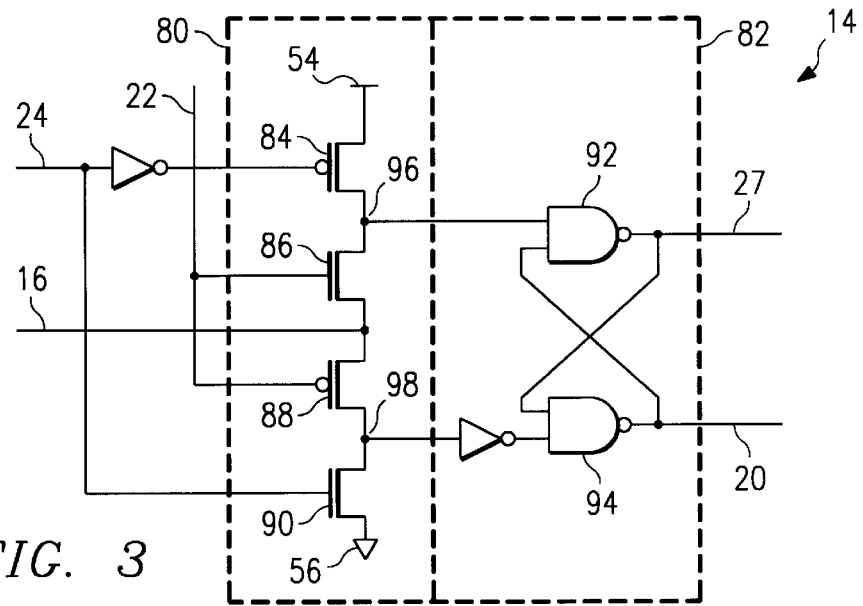
FIG. 3 illustrates a circuit diagram of a receiver in the signal transfer system.

FIG. 3 illustrates receiver 14 that includes a switching circuit 80 and a memory circuit 82. Switching circuit 80 includes a first transistor 84, a second transistor 86, a third transistor 88, and a fourth transistor 90. First transistor 84 has a source coupled to first voltage 54, a gate coupled to the inverse of precharge signal 24, and a drain coupled to the drain of second transistor 86 at node 96. Second transistor 86 has a gate coupled to intermediate voltage 22 and a source coupled to signal line 16. Third transistor 88 has a source coupled to signal line 16, a gate coupled to intermediate voltage 22, and a drain coupled to the drain of fourth transistor 90 at node 98. Fourth transistor 90 has a gate coupled to precharge signal 24 and a source coupled to second voltage 56. In a particular embodiment, transistors 84 and 88 comprise p-channel MOSFETs and transistors 86 and 90 comprise n-channel MOSFETs.

Memory 82 includes a first NAND gate 92 and a second NAND gate 94. First NAND gate 92 has inputs coupled to node 96 and the output of second NAND gate 94, and an output coupled to inverted output 27. Second NAND gate 94 has inputs coupled to node 98 and the output of NAND gate 92, and an output coupled to output 20.

In operation, precharge signal 24 transitions high and closes first transistor 84 to set node 96 to first voltage 54 (logic one). A high precharge signal 24 also closes fourth transistor 90 to set node 98 to second voltage 56 (logic zero). This state of nodes 96 and 98 applies a logic one to NAND gates 92 and 94, respectively, to maintain output 20 stored by memory circuit 82. Precharge signal 24 then goes low to open transistors 84 and 90 in preparation for the first or second transition.

In a first transition in which driver 12 drives signal line 16 to first voltage 54, third transistor 88 closes and pulls node 98 to first voltage 54 (logic one). This applies a logic zero to NAND gate 94 which causes memory circuit 82 to set output 20 to logic one. In a second transition in which driver 12 drives signal line 16 to second voltage 56, second transistor 86 closes and pulls node 96 to second voltage 56. This applies a logic zero to NAND gate 92 which causes memory circuit 82 to set output to logic zero. If signal line 16 remains at intermediate voltage 22, transistors 86 and 88 remain open and memory circuit 82 does not change output 20.

Figure 4:
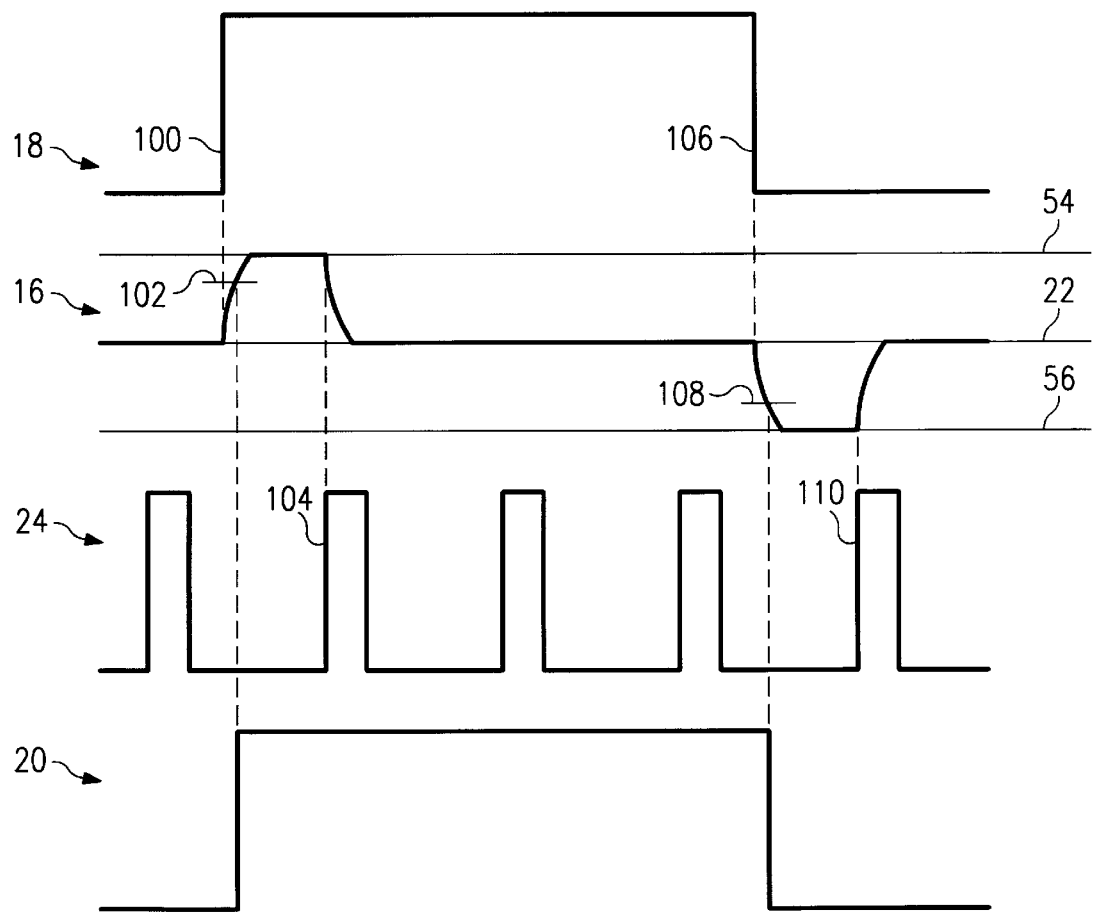
FIG. 4 illustrates a timing diagram of the signal transfer system.

FIG. 4 illustrates a timing diagram for input 18, signal line 16, precharge signal 24, and output 20. Input 18 rises from a logic zero to a logic one at first transition 100. In response, driver 12 drives signal line 16 from intermediate voltage 22 to first voltage 54. When signal line 16 rises above threshold 102, memory circuit 82 in receiver 14 causes a transition of output 20 from a logic zero to a logic one. Signal 16 remains at first voltage 54 until the next rising edge 104 of precharge signal 24. At this point, driver 12 drives signal line 16 back to intermediate voltage 22 in preparation for the next transition.

Input 18 then falls from logic one to logic zero at transition 106. In response, driver 12 drives signal line 16 from intermediate voltage 22 to second voltage 56. When signal line 16 falls below threshold 108, memory circuit 82 in receiver 14 causes output 20 to transition to logic zero. The next rising edge 110 of precharge signal 24 causes driver 12 to set signal line 16 to intermediate voltage 22 in preparation for the next transition.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A signal transfer system, comprising:
   a signal line initially having an intermediate voltage between a first voltage and a second voltage;
   a driver coupled to the signal line and operable to receive an input, the driver further operable to drive the signal line from the intermediate voltage to the first voltage if the input indicates a first transition, the driver further operable to drive the signal line from the intermediate voltage to the second voltage if the input indicates a second transition, the driver maintaining the signal line at the intermediate voltage if the input does not indicate the first transition or the second transition; and
   a receiver coupled to the signal line and operable to generate an output in response to a selected one of the first voltage and the second voltage on the signal line, the receiver maintaining the output at a previous state in response to the intermediate voltage on the signal line.

2. A method or signal transfer, comprising:
   setting a signal line to an intermediate voltage between a first voltage and a second voltage;
   receiving an input;
   driving the signal line from the intermediate voltage to the first voltage if the input indicates a first transition;
   driving the signal line from the intermediate voltage to the second voltage if the input indicates a second transition;
   maintaining the signal line at the intermediate voltage if the input does not indicate the first transition or the second transition;
   generating an output in response to a selected one of the first voltage and the second voltage on the signal line; and
   maintaining the output at a previous state in response to the intermediate voltage on the signal line.

3. A signal transfer system, comprising:
   a signal line initially having an intermediate voltage between a first voltage and a second voltage;
   a driver coupled to the signal line and operable to receive an input, the driver comprising a memory circuit, a logic circuit, and a switching circuit, the memory circuit operable to store a previous state of the input, the logic circuit coupled to the memory circuit and operable to indicate a selected one of a first transition or a second transition in response to the input and the previous state of the input, a switching circuit coupled to the logic circuit and operable to drive the signal line from the intermediate voltage to the first voltage if the input indicates the first transition, the switching circuit further operable to drive the signal line from the intermediate voltage to the second voltage if the input indicates the second transition; and
   a receiver coupled to the signal line and operable to generate an output in response to a selected one of the first voltage and the second voltage on the signal line;
   wherein the driver receives a precharge signal to set the signal line to the intermediate voltage prior to driving the signal line.

4. The system of claim 3, wherein:
   the driver maintains the signal line at the intermediate voltage if the input does not indicate the first transition or the second transition; and
   the receiver maintains the output at a previous state in response to the intermediate voltage on the signal line.

5. The system of claim 3, wherein:
   the first voltage corresponds to logic one;
   the second voltage corresponds to logic zero;
   the first transition corresponds to a transition from logic zero to logic one; and
   the second transition corresponds to a transition from logic one to logic zero.

6. The system of claim 3, wherein the intermediate voltage is approximately one-half the difference between the first voltage and the second voltage.

7. The system of claim 3, wherein the signal line comprises an internal bus of an integrated circuit.

8. The system of claim 3, wherein the precharge signal is periodic.

9. The signal transfer system of claim 3, wherein:
   said logic circuit of said driver includes
      an inverter having an input receiving the precharge signal and an output;
      a NAND gate having a first input connected to said output of said inverter, a second input receiving said input signal, a third input receiving an inverse of the previous state stored in the memory and an output;
      a NOR gate having a first input receiving the precharge signal, a second input receiving said input signal, a third input receiving said inverse of the previous state stored in the memory and an output.

10. The signal transfer system of claim 3, wherein:

said switching circuit of said driver includes
- a P-channel transistor having a source-drain path connected between the first voltage and said signal line and a gate connected to said output of said NAND gate;
- an N-channel transistor having a source-drain path connected between said signal line and the second voltage and a gate connected to said output of said NOR gate.

11. The signal transfer system of claim 3, wherein:

said receiver includes
- a first inverter having an input receiving said precharge signal and an output,
- a first P-channel transistor having a source-drain path connected between said first voltage and a first intermediate node and a gate connected to said output of said first inverter,
- first N-channel transistor having a source-drain path connected between said first intermediate node and said signal line and a gate receiving the intermediate voltage,
- a second P-channel transistor having a source-drain path connected between said signal line and a second intermediate node and a gate receiving the intermediate voltage,
- a second N-channel transistor having a source-drain path connected between said second intermediate node and the second voltage and a gate receiving the precharge signal,
- a first NAND gate having a first input connected to said first intermediate node, a second input and an output forming said output signal of said signal receiver,
- a second inverter having an input connected to said second intermediate node and an output, and
- a second NAND gate having a first input connected to said output of said first NAND gate, a second input connected to said output of said second inverter and an output connected to said second input of said first NAND gate.

12. A signal driver receiving an input signal, a periodically active precharge signal, a first voltage, a second voltage, an intermediate voltage between the first voltage and the second voltage and driving an output signal line, said signal driver comprising:
- a memory having an output and an internal state storing a prior state of the input signal;
- a first inverter having an input connected to said output of said memory and an output;
- a second inverter having an input receiving the precharge signal and an output;
- a NAND gate having a first input connected to said output of said second inverter, a second input receiving said input signal, a third input connected to said output of said first inverter and an output;
- a NOR gate having a first input receiving the precharge signal, a second input receiving said input signal, a third input connected to said output of said first inverter and an output;
- a P-channel transistor having a source-drain path connected between the first voltage and the output signal line and a gate connected to said output of said NAND gate;
- a first N-channel transistor having a source-drain path connected between the output signal line and the second voltage and a gate connected to said output of said NOR gate; and
- a second N-channel transistor having a source-drain path connected between the intermediate voltage and the output signal line and a gate receiving the precharge signal.

13. The signal driver of claim 12, wherein:

said memory includes
- a first inverter having an input receiving said precharge signal and an output,
- a first P-channel transistor having a source-drain path connected between said first voltage and a first intermediate node and a gate connected to said output of said first inverter,
- a first N-channel transistor having a source-drain path connected between said first intermediate node and the output signal line and a gate receiving the intermediate voltage,
- a second P-channel transistor having a source-drain path connected between the output signal line and a second intermediate node and a gate receiving the intermediate voltage,
- a second N-channel transistor having a source-drain path connected between said second intermediate node and the second voltage and a gate receiving the precharge signal,
- a first NAND gate having a first input connected to said first intermediate node, a second input and an output forming said output of said memory,
- a second inverter having an input connected to said second intermediate node and an output, and
- a second NAND gate having a first input connected to said output of said first NAND gate, a second input connected to said output of said second inverter and an output connected to said second input of said first NAND gate.

14. A signal receiver receiving an input line signal, a periodically active precharge signal, a first voltage, a second voltage, an intermediate voltage between the first voltage and the second voltage and driving an output signal, said signal receiver comprising:
- a first inverter having an input receiving said precharge signal and an output,
- a first P-channel transistor having a source-drain path connected between said first voltage and a first intermediate node and a gate connected to said output of said first inverter,
- a first N-channel transistor having a source-drain path connected between said first intermediate node and the input signal line and a gate receiving the intermediate voltage,
- a second P-channel transistor having a source-drain path connected between the input signal line and a second intermediate node and a gate receiving the intermediate voltage,
- a second N-channel transistor having a source-drain path connected between said second intermediate node and the second voltage and a gate receiving the precharge signal,
- a first NAND gate having a first input connected to said first intermediate node, a second input and an output forming said output signal of said signal receiver,
- a second inverter having an input connected to said second intermediate node and an output, and
- a second NAND gate having a first input connected to said output of said first NAND gate, a second input connected to said output of said second inverter and an output connected to said second input of said first NAND gate.

* * * * *